(12) United States Patent
Wu

(10) Patent No.: US 12,470,111 B2
(45) Date of Patent: Nov. 11, 2025

(54) APPARATUS FOR ADAPTING A POWER MODULE TO THE PRINTED CIRCUIT BOARD OF A MOTOR CONTROLLER

(71) Applicant: Schneider Toshiba Inverter Europe SAS, Pacy sur Eure (FR)

(72) Inventor: Cong Martin Wu, Pacy-sur-Eure (FR)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 327 days.

(21) Appl. No.: 18/167,404

(22) Filed: Feb. 10, 2023

(65) Prior Publication Data

US 2023/0262875 A1    Aug. 17, 2023

(30) Foreign Application Priority Data

Feb. 16, 2022    (EP) .................................. 22305175

(51) Int. Cl.
*H02K 11/02*    (2016.01)
*H01R 31/06*    (2006.01)
(Continued)

(52) U.S. Cl.
CPC ........... *H02K 11/02* (2013.01); *H01R 31/065* (2013.01); *H05K 1/0216* (2013.01); *H05K 1/181* (2013.01); *H05K 7/209* (2013.01)

(58) Field of Classification Search
CPC ........ H02K 11/00; H02K 11/02; H01R 31/00; H01R 31/0065; H05K 1/00; H05K 1/0216; H05K 1/181; H05K 7/00; H05K 7/209

See application file for complete search history.

(56) References Cited

U.S. PATENT DOCUMENTS

| | | | | |
|---|---|---|---|---|
| 5,497,289 A | * | 3/1996 | Sugishima | ............. H05K 7/209 361/600 |
| 10,269,681 B2 | * | 4/2019 | Kikugawa | ............. H01L 23/367 |

(Continued)

FOREIGN PATENT DOCUMENTS

| | | |
|---|---|---|
| DE | 102016103247 A1 | 9/2016 |
| DE | 102017217418 A1 | 4/2019 |

OTHER PUBLICATIONS

European Search Report and Search Opinion dated Jul. 27, 2022 for corresponding European Patent Application No. 22305175.6, 5 pages.

*Primary Examiner* — Imani N Hayman
*Assistant Examiner* — Ross Terry Mularski
(74) *Attorney, Agent, or Firm* — Kinney & Lange, P.A

(57) ABSTRACT

An apparatus for adapting an intelligent power module to a main circuit board of a motor controller, including: an adapter circuit board having fixed interface contact pins configured to be plugged into interface contact elements of the main circuit board of the motor controller, the power module having contact pins having a first pin out configuration connected on the adapter circuit board, wherein the adapter circuit board provides a cross pin configuration between the first pin out configuration of the power module and the interface contact pins having a second pin out configuration in order to connect the power module to the main circuit board, a set of capacitors connecting points on the adapter circuit board and capacitors connected to at least some of the capacitors connecting points and configured to reduce a radiated emission level of the motor controller, the capacitance of the capacitors being designed to reach a target threshold for the radiated emission level of the motor controller.

20 Claims, 5 Drawing Sheets

(51) Int. Cl.
    *H05K 1/02*    (2006.01)
    *H05K 1/18*    (2006.01)
    *H05K 7/20*    (2006.01)

(56) References Cited

U.S. PATENT DOCUMENTS

2020/0313504 A1   10/2020   Okochi et al.
2020/0358221 A1*  11/2020   Kim .................. H05K 7/209

* cited by examiner

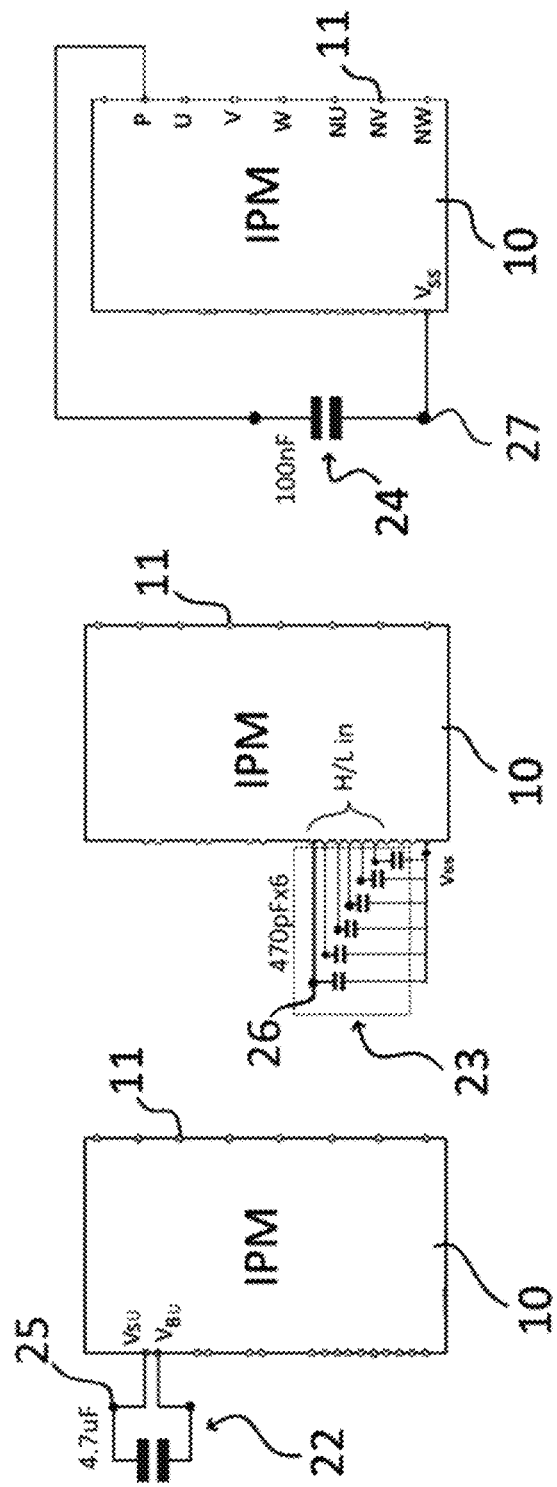

APPARATUS FOR ADAPTING A POWER MODULE TO THE PRINTED CIRCUIT BOARD OF A MOTOR CONTROLLER

FIELD OF THE INVENTION

The present disclosure concerns motor controllers such as variable speed drives or soft starters for three phase motors such as asynchronous three phase motors which are powered through a three-phase IGBT based Intelligent Power Module (IPM) under control of a controller module and concerns an apparatus for adapting such an Intelligent Power Module to the printed circuit board of such a motor controller.

BACKGROUND

Controller modules comprising an intelligent power module are well known in the art and several different IPM are available on the market for such use. Such controllers modules must comply with several standards and regulation and design of such products is time consuming and costly to guarantee a long-lasting life, low electromagnetic emissions, and safety even if the basic principle of such controllers is well known.

In consequence changes in the design of a main circuit board of the controller module is preferably avoided and an issue arises when a change of IPM is needed since such products are usually single source designs and have different pinouts and electrical and mechanical characteristics between manufacturers but may also have different electromagnetic emissions characteristics which could, in case of a change of IPM type, render the product non-compliant with previously satisfied EMI regulations. Then there is a need for a simple system for allowing the use of different IPM without changing a main circuit board of a controller module designed for receiving a specific IPM.

SUMMARY OF THE INVENTION

In view of the above problems and in order to provide flexibility in the manufacturing of motor controllers with IPM, the present disclosure proposes an apparatus for adapting an intelligent power module to a main circuit board of a motor controller, comprising:

an adapter circuit board having fixed interface contact pins configured to be plugged into interface contact elements of said main circuit board of said motor controller, said power module having contact terminals having a first pin out configuration connected on the adapter circuit board, wherein the adapter circuit board provides a cross pin configuration between said first pin out configuration of said power module contact terminals and said interface contact pins having a second pin out configuration in order to connect said power module to said main circuit board and comprises a set of capacitors connecting points on the adapter circuit board and capacitors connected to at least some of said capacitors connecting points and configured to reduce a radiated emission level of the motor controller, the capacitance of said capacitors being designed to reach a target threshold for the radiated emission level of the motor controller.

Such arrangement provides an easily adaptable power module board and allows a quick adaptation of the electromagnetic and radio emission level of the power module without modifying the electromagnetic and radio emission level of a main board of the motor controller thus avoiding the need to start again EMI/RFI qualification procedures for the complete product.

In realization modes which may be combined or alternatives:
- The motor controller may be a variable speed drive for the motor;
- The set of connecting points may comprise connecting points for at least one bootstrap capacitor for said power module;
- The set of connecting points may comprise connecting points for at least one gate input filter capacitor for said power module;
- The set of connecting points may comprise connecting points for at least one bulk decoupling capacitor for said power module. The operator may then choose the most appropriate combination of capacitors to reduce the emission of radiofrequency interferences.

The present disclosure also concerns a motor controller comprising a main circuit board, an apparatus as disclosed and a heatsink wherein the power module is located between said heatsink and said adapter circuit board and is attached to the heatsink.

This arrangement provides a simple and easy assembly of the power module with the main circuit board and heatsink.

The power module is preferably attached to the heatsink with screws, said adapter circuit board being provided with holes of a diameter greater than a diameter of heads of said screws in order to screw the power module already soldered on the adapter circuit board on the heatsink. This provides a good heat transfer between the power module and the heatsink and easy assembly.

In further realization modes which may be combined or alternatives:
- The interface contact pins of said adapter board may be plugged in contact vias of said main circuit board;
- The adapter circuit board and the power module may be located between said heatsink and said main circuit board;
- The motor controller may comprise an insulating mounting frame surrounding sides of said adapter circuit board and power module and locating said main circuit board with respect to said heatsink and said adapter circuit board;
- The main circuit board may be attached to the mounting frame through resilient fingers with hook ends;
- The insulating mounting frame may be attached to the heatsink with screws;
- The motor controller may comprise a cover attached to the insulating mounting frames through pegs received in holes;
- The motor controller may comprise a supervision device with display and keys attached to the cover;
- The interface contact pins of the adapter circuit board and the contact vias of the main circuit board may be configured in a single line or in two lines;
- The interface contact elements may be press-fit pins.

BRIEF DESCRIPTION OF THE DRAWINGS

FIGS. 4A, 4B, 4C are example of possible capacitors arrangements in connection with the disclosure;

DETAILED DESCRIPTION OF EMBODIMENTS OF THE INVENTION

The present disclosure concerns a motor controller such as a variable speed drive or a soft starter for an electric motor where the motor is driven through an inverter module having power MOSFETs or IGBTs such as known under the trademark CIPOS™ of the company Infineon Technologies AG or other components manufacturers. Such a module called Intelligent Power Modules (hereafter IPM) as these include integrated gate drivers, temperature sensors and other security items such as fault indication and overload protection.

Motor controllers designed with such IPMs are usually built around a specific IPM and comprise a main PCB with dedicated layout pattern comprising the motor control and protection electronics on which the IPM is soldered. These motor controllers need to fulfil quite strict EMI/RFI standards and once a main PCB with ITS IPM is qualified, modifications to the main PCB design cannot be done without complete testing of the board for EMI/RFI compatibility and possibly additional redesign steps in case issues arise.

Therefore, a solution is needed in order to be able to change the IPM device in case of shortages on a component reference, cost increase, existence of a new device with improved characteristics or changes in requirements or in product design depending on the standards or customer's need.

Figure 1:
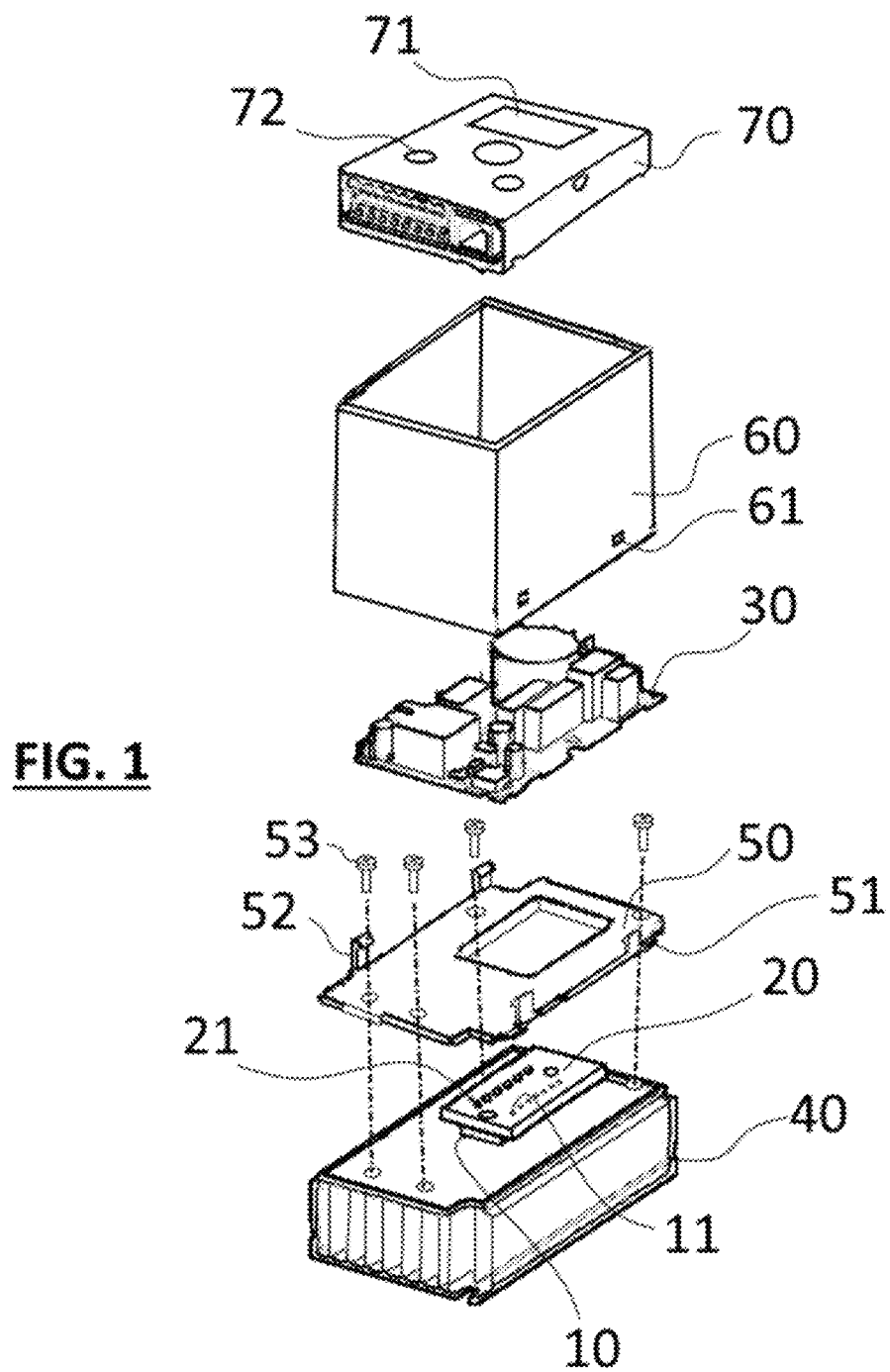
FIG. 1 is an exploded perspective view of a motor controller.

An example of a motor controller device in accordance with the present disclosure is shown in FIG. 1.

This motor controller comprises a main circuit board 30 which comprises motor control components such as speed control device, soft starter device, a heatsink 40 for cooling power components of the motor control components including an intelligent power module 10 which according to the disclosed design is located between said heatsink 40 and an adapter circuit board 20.

Figure 3A:
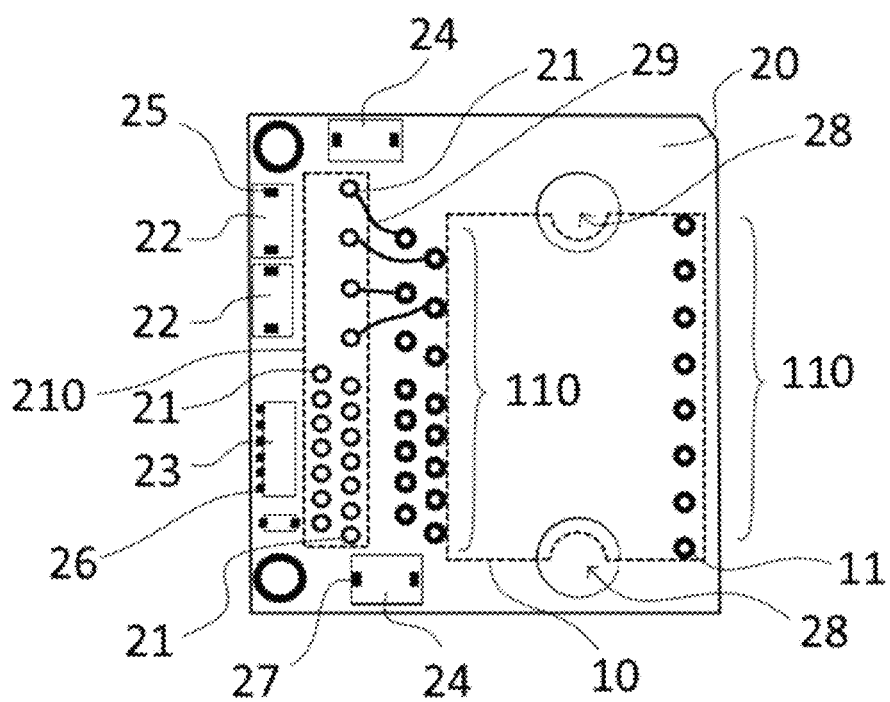
FIGS. 3A and 3B are views from the top of an apparatus in accordance with aspects of the disclosure.

The adapter circuit board 20 shown in FIG. 3A is part of an apparatus for adapting an intelligent power module 10 to a main circuit board 30 of the motor controller.

The adapter circuit board 20 has fixed interface contact pins 21 configured to be plugged into interface contact elements such as contact sockets or metallized via holes of the main circuit board.

Figure 3B:
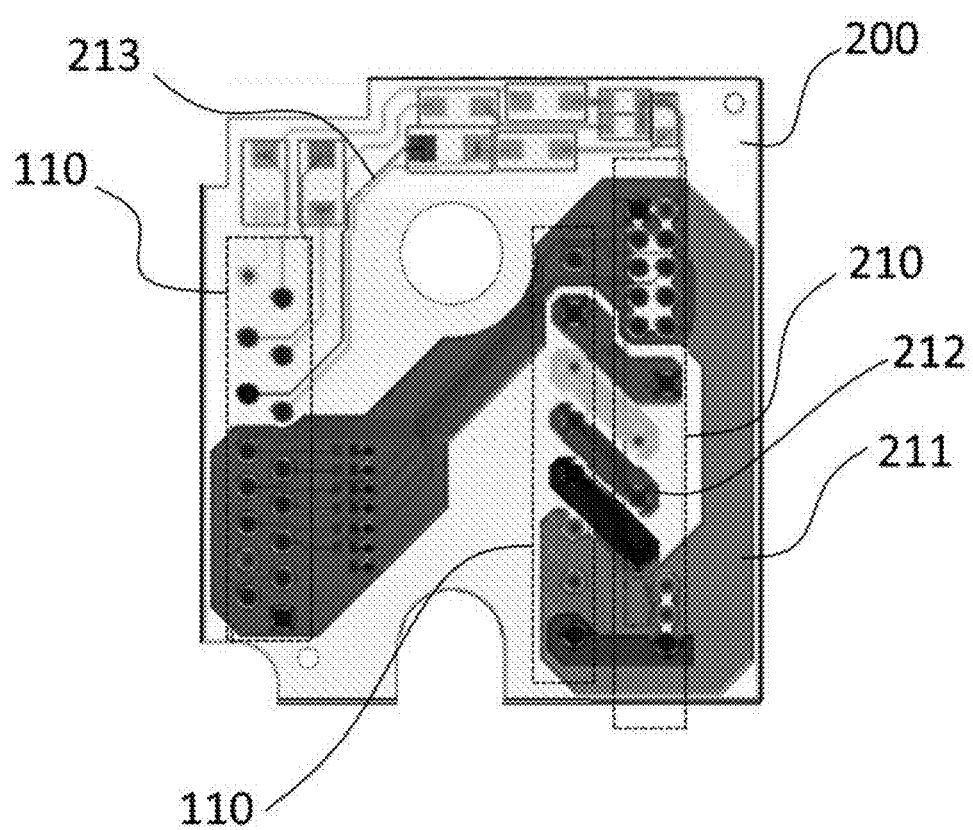

The adapter circuit board comprises tracks 29 (only four being represented in order not to render the figure too complicated) connecting such interface contact pins 21 with contact terminals 11 of the IPM. FIG. 3B gives an example of PCB tracks for such an IPM.

The IPM has a first pin out configuration 110 and the interface contact pins have a second pinout configuration 210. The tracks 29 of the adapter circuit board 20 provide a cross pin configuration between said first pin out configuration 110 of said power module and said second pin out configuration 210 in order to connect said power module 10 to said main circuit board 30. This allows to redesign only the adapter circuit board in case of integration of a different IPM with a different pin out configuration without modifying the main circuit board.

In addition, the adapter circuit board comprises a set of capacitors connecting points 25, 26, 27 to receive capacitors 22, 23, 24 and to connect such capacitors to specific pins of the IPM as shown in FIG. 4A, 4B or 4C for an IMP of Infineon Technologies AG known under the reference IGCM04G60HA.

An illustrative example of multilayer PCB 200 is given in FIG. 3B which shows upper and lower sides tracks including a ground track 211, power tracks 212 and signal or decoupling tracks 213.

The capacitor connecting points permit to select relevant capacitors to provide a reduction of the radiated emission level of the motor controller, the capacitance of said capacitors being designed to reach a target threshold for the radiated electromagnetic interferences emission level of the motor controller.

In FIG. 4A, a capacitor 22 is connected to pin $V_{SU}$ of an IPM, such pin being a U-phase high side floating IC supply offset voltage and connected to pin $V_{BU}$ of the IPM, such pin being a U-phase high side floating IC supply voltage. Such capacitor is a bootstrap capacitor for phase U of the motor. The same capacitors are present on phases V and W not represented. In the example the capacitor 22 is a 4.7 μF capacitor but the value of the capacitor is chosen depending on the IPM and switching frequency for the power supply of the motor and expected EMI level.

In FIG. 4B, capacitor 23 which is a multiple capacitors component is connected to the U, V, W phases high side gate drivers inputs and the U, V, W phases low side gate drivers inputs regrouped under the reference H/L in. Multiple capacitor 23 provides control filter capacitors for all six gate inputs. The capacitor value is here 470 μF for each of the H/L in capacitor but may be also adapted to the specific application.

In FIG. 4C, capacitor 24 is connected between a positive bus voltage P and the low side control negative supply $V_{SS}$ to provide a bulk decoupling. The capacitor value is here 100 nF but such value may also be adapted to the situation.

Figure 2:
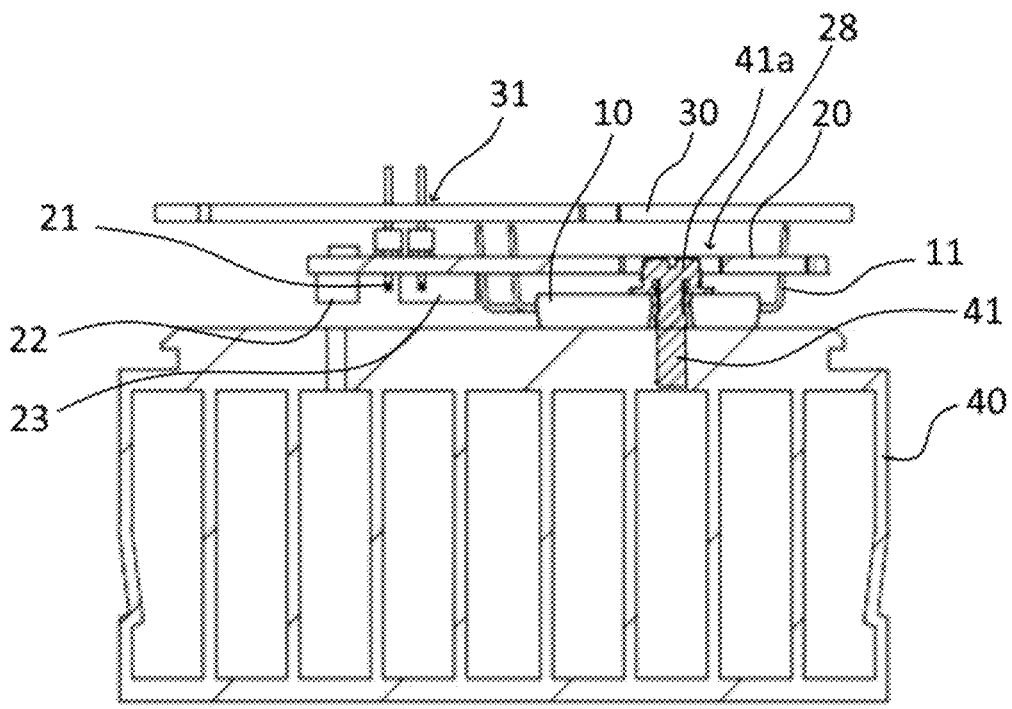
FIG. 2 is a side view of an assembly of an apparatus in accordance with aspects of the disclosure with a main board and an heatsink.

FIG. 2 disclose the assembly of the adapter circuit board, IPM and main circuit board.

The IPM 20 is attached to the heatsink with screws 41, and the adapter circuit board is provided with holes 28 of a diameter greater than a diameter of heads 41a of said screws in order to screw the IPM 10 on the heatsink 40 while such IPM is already soldered on the adapter circuit board 20.

The interface contact pins 21 of the adapter board 20 are plugged in contact vias 31 such as metallized holes of said main circuit board 30.

the interface contact pins 21 of the adapter circuit board and the contact sockets or metallized vias 31 of the main circuit board are configured in a single line or in two lines.

The interface contact pins 21 may have a force insertion profile also known as press-fit in order to avoid a soldering operation.

The adapter circuit board 30 and the IPM 10 are then located between the heatsink 40 and the main circuit board 30.

Back to FIG. 1, the motor controller comprises an insulating mounting frame 50 surrounding sides of said adapter circuit board and power module and locating said main circuit board with respect to said heatsink and said adapter circuit board 20. In the proposed design, the main circuit board 30 is attached to the insulating mounting frame 50 through resilient fingers with hook ends 52 but the main circuit board could also be attached to the mounting frame with screws or other mounting means.

A purpose of the mounting frame is to provide a precise positioning of the main circuit board with respect to the adapter board and a secure connection of the adapter board interface contact pins 21 in the receiving contact sockets or metallized via holes 31 of the main circuit board.

On the heatsink side, the insulating mounting frame is attached to the heatsink with screws 53.

The motor controller as described comprises also a cover 60 attached to the insulating mounting frames through pegs 51 of such mounting frame received in holes 61 of the cover while the cover side walls are received on the mounting plate side walls.

A supervision device 70, or human machine interface, with display 71 and keypad 72 is attached on a top side of the cover opposed to the heatsink. Such device provides commands issued from an operator to the mainboard microcontroller which provides the control commands for the IPM controlling the motor.

Figure 5:
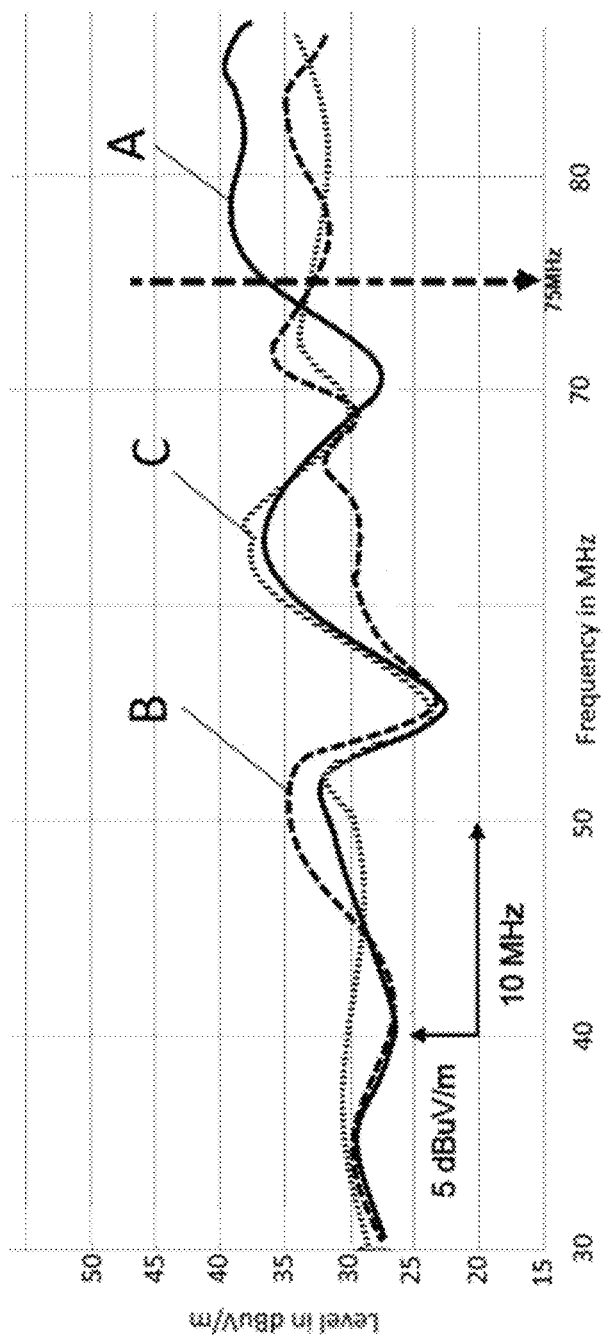
FIG. 5 is an example of electromagnetic emission chart with various configurations.

As said above an advantage of the apparatus of the present disclosure is to provide a simple way to solve electromagnetic interferences issues of the controller when a change of IPM type occurs. FIG. 5 gives an example of electromagnetic interference measurements done using a Biconical antenna with vertical polarization at a height of 1.75 m 10 meters away from the motor controller under test having a switching frequency of 4 kHz for a motor frequency of 5 Hz and a motor cable length of 5 m and an IMP of the type IKCM15L60GA from Infineon Technologies AG.

Curve A shows the emission of a motor controller having no capacitors on the adapter circuit board, curve B shows the same configuration but with bulk decoupling capacitors 24 as in FIG. 4C between $V_{SS}$ and P the positive voltage entry of the IPM switches and curve C shows the same adapter circuit board and IPM but with bootstrap capacitor as in FIG. 4A.

It can be seen that a reduction of interferences above 75 MHz is obtained with the use of the capacitors. Other configurations and cut frequencies can be obtained with other combinations of capacitors.

The apparatus of the present disclosure permits also to test various IMP components, each with its specific adapter circuit boards cabling, in the same situation in order to select the less interfering component if needed. This can be done, thanks to the present disclosure, without any modification to the motor controller and main circuit board, the adapter board being the only modified element.

The above description is not intended to limit the invention which is defined in the appended claims but provides an exemplary realization. In particular, the number and position of capacitors, the pinout of the IPM and position of the interface contact pins are only possible solutions between other without limiting the scope of the claims.

The invention claimed is:

1. An apparatus for adapting an intelligent power module to a main circuit board of a motor controller, comprising:
   an adapter circuit board having fixed interface contact pins configured to be plugged into interface contact elements of said main circuit board of said motor controller, said power module having contact terminals having a first pin out configuration connected on the adapter circuit board, wherein the adapter circuit board provides a cross pin configuration between said first pin out configuration of said power module and said interface contact pins having a second pin out configuration in order to connect said power module to said main circuit board,
   a set of capacitors connecting points on the adapter circuit board, and
   capacitors connected to at least some of said capacitors connecting points and configured to reduce a radiated emission level of the motor controller, the capacitance of said capacitors being designed to reach a target threshold for the radiated emission level of the motor controller.

2. The apparatus according to claim 1 wherein the motor controller is a variable speed drive for the motor.

3. The apparatus according to claim 1 wherein the set of connecting points comprises connecting points for at least one bootstrap capacitor for said power module.

4. The apparatus according to claim 1 wherein the set of connecting points comprises connecting points for at least one gate input filter capacitor for said power module.

5. The apparatus according to claim 1 wherein the set of connecting points comprises connecting points for at least one bulk decoupling capacitor for said power module.

6. A motor controller comprising a main circuit board, an apparatus according to claim 1 and a heatsink wherein the power module is located between said heatsink and said adapter circuit board and is attached to the heatsink with screws, said adapter circuit board being provided with holes of a diameter greater than a diameter of heads of said screws in order to screw the power module already soldered on the adapter circuit board on the heatsink.

7. The motor controller according to claim 6 wherein said interface contact pins of said adapter board are plugged in contact vias of said main circuit board, said adapter circuit board and said power module being located between said heatsink and said main circuit board.

8. The motor controller according to claim 7 further comprising an insulating mounting frame surrounding sides of said adapter circuit board and power module and locating said main circuit board with respect to said heatsink and said adapter circuit board.

9. The motor controller according to claim 8 where the main circuit board is attached to the insulating mounting frame through resilient fingers with hook ends.

10. The motor controller according to claim 6 wherein the insulating mounting frame is attached to the heatsink with screws.

11. The motor controller according to claim 6 comprising a cover attached to the insulating mounting frames through pegs received in holes.

12. The motor controller according to claim 11 comprising a supervision device with display and keys attached to the cover.

13. The motor controller according to claim 6 wherein the interface contact elements of the adapter circuit board and the contact vias of the main circuit board are configured in a single line or in two lines.

14. The motor controller according to claim 6 wherein the interface contact elements of the adapter circuit board are press-fit pins.

15. The apparatus according to claim 1 wherein said main circuit board of the motor controller has a dedicated layout pattern, comprising motor control and protection electronics, which is configured to have a first type of intelligent power module directly connectable thereto;
   the power module comprises a second type of intelligent power module which is different than the first type of intelligent power module; and
   the adapter circuit board is configured to enable interconnection of the main circuit board of the motor controller to the second type of intelligent power module.

16. The apparatus according to claim 15 wherein the dedicated layout pattern of said main circuit board is configured to have the first type of intelligent power module soldered thereon.

17. The motor controller according to claim 6 wherein said main circuit board of the motor controller has a dedicated layout pattern, comprising motor control and protection electronics, which is configured to have first type of intelligent power module directly connectable thereto;

the power module comprises a second type of intelligent power module which is different than the first type of intelligent power module; and the adapter circuit board is configured to enable interconnection of the main circuit board of the motor controller to the second type of intelligent power module.

18. The motor controller according to claim 17 wherein the dedicated layout pattern of said main circuit board is configured to have the first type of intelligent power module soldered thereon.

19. The apparatus according to claim 1 wherein the capacitors connected to at least some of said capacitors connecting points of the adapter circuit board include at least one capacitor comprising a bootstrap capacitor for the power module, a gate input filter capacitor for the power module, or a bulk decoupling capacitor for the power module.

20. The apparatus according to claim 1 wherein the motor controller is for a multi-phase motor having a plurality of phases, and the capacitors connected to at least some of said capacitors connecting points of the adapter circuit board include a capacitor, comprising a bootstrap capacitor or a gate input filter capacitor for the power module, for each of the plurality of phases of the multi-phase motor.

* * * * *